United States Patent
Chen et al.

(10) Patent No.: US 8,823,022 B2
(45) Date of Patent: Sep. 2, 2014

(54) LIGHT EMITTING DEVICE

(75) Inventors: Chao Hsing Chen, Hsinchu (TW); Chien Fu Shen, Hsinchu (TW); Tsun Kai Ko, Hsinchu (TW); Schang Jing Hon, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 381 days.

(21) Appl. No.: 13/209,085

(22) Filed: Aug. 12, 2011

(65) Prior Publication Data
US 2012/0049209 A1    Mar. 1, 2012

Related U.S. Application Data

(60) Provisional application No. 61/378,191, filed on Aug. 30, 2010.

(51) Int. Cl.
*H01L 33/08* (2010.01)
(52) U.S. Cl.
USPC .. 257/88; 257/98; 257/E33.012; 257/E33.066
(58) Field of Classification Search
None
See application file for complete search history.

(56) References Cited

U.S. PATENT DOCUMENTS

| | | | | |
|---|---|---|---|---|
| 4,538,342 A | * | 9/1985 | Camlibel et al. | 438/22 |
| 2008/0179602 A1 | * | 7/2008 | Negley et al. | 257/88 |
| 2009/0050907 A1 | * | 2/2009 | Yuan et al. | 257/88 |
| 2011/0057569 A1 | * | 3/2011 | Wei et al. | 315/122 |

* cited by examiner

*Primary Examiner* — Minh-Loan T Tran
*Assistant Examiner* — Fazli Erdem
(74) *Attorney, Agent, or Firm* — Patterson & Sheridan, LLP

(57) ABSTRACT

A light emitting device includes a serially-connected LED array of a plurality of LED cells epitaxially formed on a substrate. The LED array includes a first LED cell, and a second LED cell adjacent to each other, and a serially-connected LED sub-array including at least three LED cells intervening the first and the second LED cells. Each LED cell includes a first semiconductor layer formed on the substrate; a second semiconductor layer formed on the first semiconductor layer; and an active layer formed between the first semiconductor layer and the second semiconductor layer; wherein the distance between the first semiconductor layer of the first LED cell and that of the second LED cell is larger than 30 μm, and one of the first semiconductor layers and/or one of the second semiconductor layers of the LED cells includes a round corner with a radius of curvature not less than 15 μm.

40 Claims, 12 Drawing Sheets

LIGHT EMITTING DEVICE

REFERENCE TO RELATED APPLICATION

This application claims the right of priority based on U.S. provisional application Ser. No. 61/378,191, filed on Aug. 30, 2010, and the content of which is hereby incorporated by reference in its entirety.

TECHNICAL FIELD

The disclosure relates to a light emitting device, and more particularly to a light emitting device with the ability of electrostatic discharge (ESD) protection.

DESCRIPTION OF BACKGROUND ART

FIG. 1 shows an illustration of a light emitting device 10. The light emitting device 10 comprises a plurality of LED cells 11 (A, B, C, C1, C2, C3) connecting in series by conducting metals 13 on a single substrate 15, wherein each LED cell 11 comprises a first semiconductor layer 17 on the substrate 15, a second semiconductor layer 19 on the first semiconductor layer 17, an active layer 47 (not shown in FIG. 1) arranged between the first semiconductor layer 17 and the second semiconductor layer 19, and a conducting metal 13 arranged on the second semiconductor layer 19. When one polarity of the AC input passes from conducting region α to conducting region β, the current flows through the LED cells 11 in the following order: A→C1→C2→C3→C→B. The largest potential difference of the LED cells 11 occurs between LED cells A and B. As shown in FIG. 1, the serially-connected LED array further comprises a serially-connected sub-array with four LED cells 11 (C1, C2, C3, C) intervening the terminal LED cells A and B in the series connection.

As shown in FIG. 1, LED A and LED B further comprise a first side (A1, B1) and a second side (A2, B2), respectively. The first sides (A1, B1) of LED A and LED B neighbor to the sub-array, and the second sides (A2, B2) of LED A and LED B neighbor to each other. Besides, a trench T is formed between LED A and LED B. Namely, the trench T is formed between the second sides of LED A and LED B.

Normally, the forward voltage for one LED cell 11 is about 3.5 volt, so the voltage difference between LED cells A and B should be about 3.5*6=21 volts under normal working situation. Because the distance between LED cells A and B is very short (about 10~100 μm), the electric field strength (E=V/D, V=potential difference, D=distance) between LED cells A and B is high.

Besides, if there is suddenly a strong electrostatic field from the outside environment (such as from the human body or the working machine) injecting into the conducting region α, an ultra-high electrical voltage is further inputting to LED cell A, and causes the largest potential difference between LED cells A and B. When the value of the electric field strength reaches a certain value by the strong electrostatic field from the outside environment, the mediums (air, glue, or other dielectric materials) therebetween may be ionized, and parts of LED cells A and B within the electrical field strength are damaged (the damage region 12) by discharging, which is called the ESD (electrostatic discharge) damage. The SEM picture of the ESD damage situation is shown in FIG. 2, wherein the ordinary current flow 14 flows in the direction as the arrows indicated in the figure.

SUMMARY OF THE DISCLOSURE

The present disclosure provides a light emitting device including a substrate and a serially-connected LED array of a plurality of LED cells epitaxially formed on the substrate, and the serially-connected LED array including a first LED cell; a second LED cell; and a serially-connected LED sub-array including at least three LED cells intervening the first and the second LED cells; wherein each LED cell of the serially-connected LED array including a first semiconductor layer formed on the substrate; a second semiconductor layer formed on the first semiconductor layer; and an active layer formed between the first semiconductor layer and the second semiconductor layer; wherein the first LED cell and the second LED cell are adjacent to each other, and the distance between the first semiconductor layer of the first LED cell and the first semiconductor layer of the second LED cell is larger than 30 μm, wherein one of the first semiconductor layers and/or one of the second semiconductor layers of the LED cells includes at least a round corner with a radius of the curvature not less than 15 μum.

A light emitting device in accordance with another embodiment of the disclosure, includes a substrate, and a serially-connected LED array formed on the substrate, and the serially-connected LED array including a plurality of LED cells on the substrate, including a first LED cell, a second LED cell, and a serially-connected LED sub-array including at least three LED cells intervening the first and second LED cells; wherein each LED cell of the serially-connected LED array includes a first semiconductor layer formed on the substrate, a second semiconductor layer formed on the first semiconductor layer, and an active layer formed between the first semiconductor layer and the second semiconductor layer; wherein the first LED cell and the second LED cell are adjacent to each other, and the distance between the first semiconductor layer of the first LED cell and the first semiconductor layer of the second LED cell is larger than 30 μm, wherein each of the first and second LED cell includes a first side and a second side, the first sides of the first LED cell and the second LED cell neighbor to the LED sub-array, and the second side of the first LED cell neighbors to the second side of the second LED cell, wherein the corners of the first semiconductor layer of the first LED cell and the second LED cell near the second sides are round.

A light emitting device in accordance with another embodiment of the disclosure, including a substrate, and a serially-connected LED array, and the serially-connected LED array including a plurality of LED cells on the substrate, including a first LED cell, a second LED cell, and a serially-connected LED sub-array including at least three LED cells intervening the first and second LED cell; wherein each of the first and second LED cell including a first side and a second side, the first side of the first LED cell and/or the second LED cell neighboring to the LED sub-array, and the second side of the first LED cell neighboring to the second side of the second LED cell; wherein a first minimum distance between the second side of the first LED cell and the second side of the second LED cell is larger than a second minimum distance between any two adjacent LED cells in the LED sub-array, wherein each LED cell includes an active layer arranged between a first semiconductor layer and a second semiconductor layer, a conducting metal arranged on the second semiconductor layer; and the conducting metal includes an extending part with at least one finger, wherein one of the first semiconductor layers and/or one of the second semiconductor layers of the LED cells includes at least a round corner with a radius of the curvature not less than 15 μum.

A light emitting device, in accordance with another embodiment of the disclosure, including a substrate, and a serially-connected LED array, and the serially-connected LED array including a first LED cell, a second LED cell, and a serially-connected LED sub-array including at least three LED cells intervening the first and second LED cells; wherein each of the first and second LED cells includes a first side and a second side, the first side of the first LED cell and/or the second LED cell neighbors to the LED sub-array, and the second side of the first LED cell neighbors to the second side of the second LED cell; wherein a first minimum distance between the second side of the first LED cell and the second side of the second LED cell is larger than a second minimum distance between any two adjacent LED cells in the LED sub-array, wherein the corners of the first semiconductor layer of the first LED cell and the second LED cell near the second sides are round.

DETAILED DESCRIPTION OF PREFERRED EMBODIMENTS

The embodiments are described hereinafter in accompany with drawings. To better and concisely explain the disclosure, the same name or the same reference number given or appeared in different paragraphs or figures along the specification should has the same or equivalent meanings while it is once defined anywhere of the disclosure.

Figure 1:
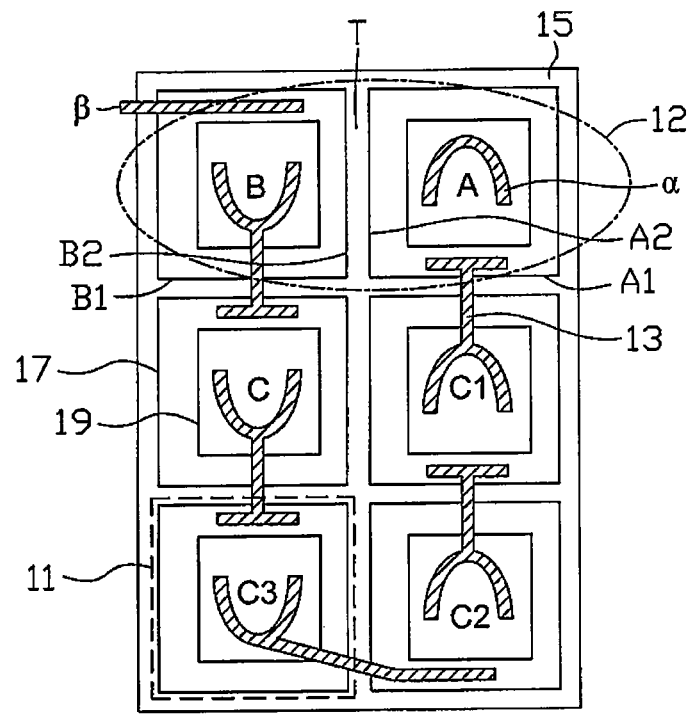
FIG. 1 illustrates the structure of a conventional light emitting device.
Figure 2:
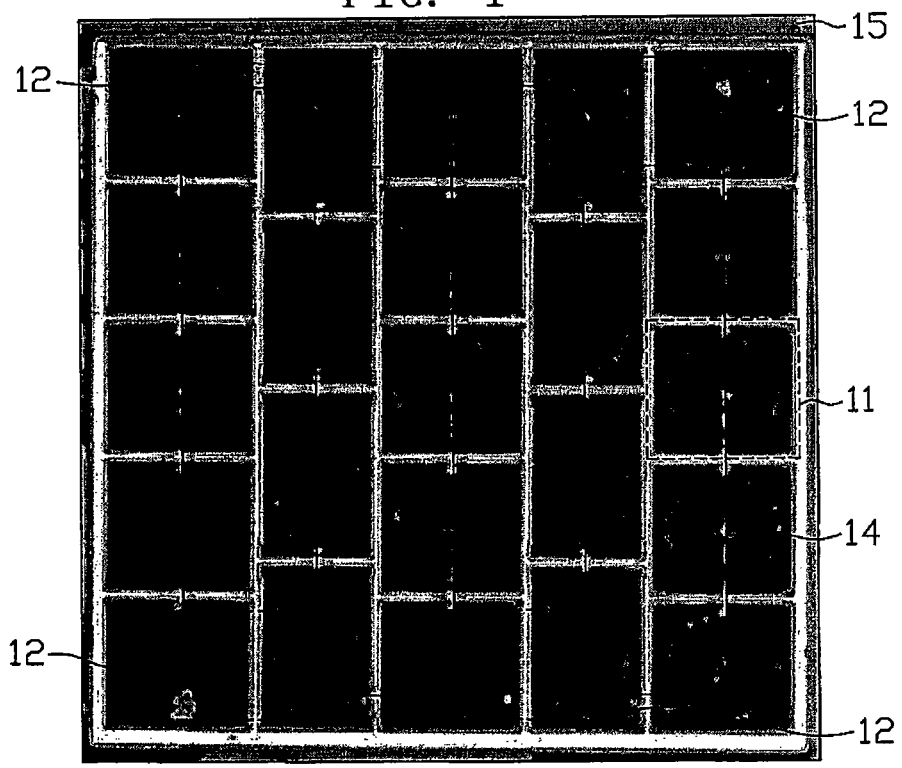
FIG. 2 illustrates an SEM picture of a light emitting device in accordance with an embodiment of the disclosure.
Figure 3:
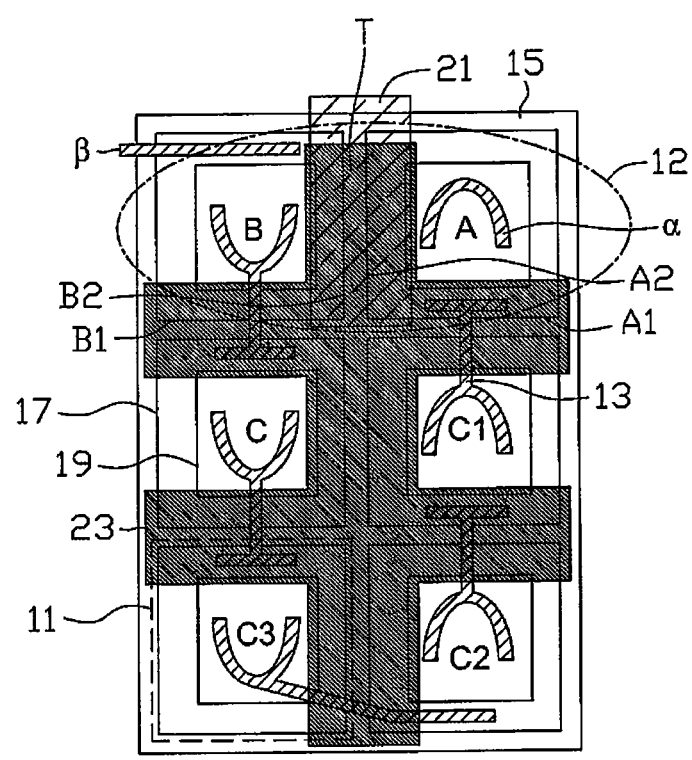
FIG. 3 illustrates a light emitting device in accordance with an embodiment of the disclosure.

In order to solve the ESD damage problem, FIG. 3 shows a light emitting device 20 in accordance with one embodiment of the present disclosure. The light emitting device 20 comprises a plurality of LED cells 11 (A, B, C, C1, C2, C3) connecting in series by conducting metals 13 on a single substrate 15, wherein each LED cell 11 comprises a first semiconductor layer 17 on the substrate 15, a second semiconductor layer 19 on the first semiconductor layer 17, an active layer 47 (not shown in FIG. 3) arranged between the first semiconductor layer 17 and the second semiconductor layer 19, and a conducting metal 13 arranged on the second semiconductor layer 19. As can be seen in FIG. 3, each conducting metal 13 further comprises the extending part with at least two divided metal lines. The number of the divided metal lines extended from each extending part is not limited to what is disclosed herein. In order to have the LED array connected in series, the first semiconductor layer 17 of LED A is electrically connected to the second semiconductor layer 19 of the adjacent LED cell, for example, LED C1. When one polarity of the AC input passes from conducting region α to conducting region β, the current flows through the LED cells 11 in the following order: A→C1→C2→C3→C→B. The largest potential difference of the LED cells 11 occurs between LED cells A and B. As shown in FIG. 3, the serially-connected LED array further comprises a serially-connected sub-array with four LED cells 11 (C1, C2, C3, C) intervening the terminal LED cells A and B in the series connection.

As shown in FIG. 3, LED A and LED B further comprise a first side (A1, B1) and a second side (A2, B2), respectively. The first sides (A1, B1) of LED A and LED B neighbor to the sub-array and the second sides (A2, B2) of LED A and LED B neighbor to each other. Besides, a trench T is formed between LED A and LED B. Namely, the trench T is formed between the second sides of LED A and LED B.

To prevent the ESD damage, a protecting structure is formed near the trench T to prevent the light emitting device from being damaged at a region near the trench by a surge voltage higher than a normal operating voltage. In this embodiment, a first insulating layer 23 is formed between the LED cells, and a second insulating layer 21 is further formed over the first insulating layer 23 in the region between two LED cells 11 with high electrical field strength, for example, the trench T. The second insulating layer 21 can be optionally thicker than the first insulating layer 23. Taking the light emitting device 20 in FIG. 3 for instance, LED A and LED B are electrically connected in series with four (more than three) LED cells 11 connected in-between and therefore suffer a high electric field strength over a certain value, and therefore the second insulating layer 21 is formed to cover the part of the top surfaces of the first insulating layer 23 and part of the top surfaces of LED A and LED B to isolate the LED cells 11 from the ESD damage. Besides, without the first insulating layer 23, the second insulating layer 21 only can also be the protecting structure to cover the region between two LED cells 11 with high electrical field strength, for example, the exposed surfaces of the substrate 15, the side surface of the first semiconductor layer 17, and the side surface of the second semiconductor layer 19 between LED cells A and B. Besides, the materials of the insulating layer 21 and/or 23 can be insulating materials such as $AlO_{x1}$, $SiO_{x2}$, $SiN_{x3}$, and so on, and the insulating layer 21 and/or 23 may be a composite structure with multi layers formed by different materials. For example, the second insulating layer 21 may be formed by the combination of one layer of $SiO_{x4}$ with the thickness of 2100 Å and one layer of $AlO_{x5}$ with the thickness of 2000 Å, and the first insulating layer 23 may be formed by only one layer of $SiO_{x4}$ with the thickness of 2100 Å. (The index words X1-X5 here are numbers, which could be integers or decimals, and can be the same or different.)

Figure 4:
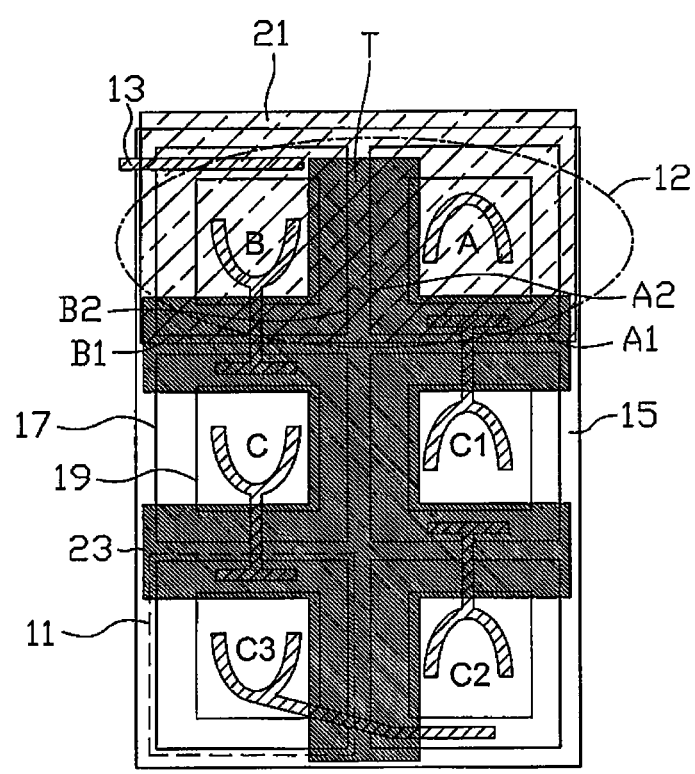
FIG. 4 illustrates a light emitting device in accordance with an embodiment of the disclosure.

FIG. 4 shows a light emitting device 30 in accordance with another embodiment of the present disclosure. As can be seen, the second insulating layer 21 covers most part of the top surfaces of LED A and LED B. For the same reason mentioned above, the insulating layers 21 and 23 can also be a composite structure with multi layers formed by different materials or a thick single layer, and the number or the thickness of the second insulating layer 21 on the covered top surfaces of LED A and LED B can be more than those in other regions.

Figure 5:
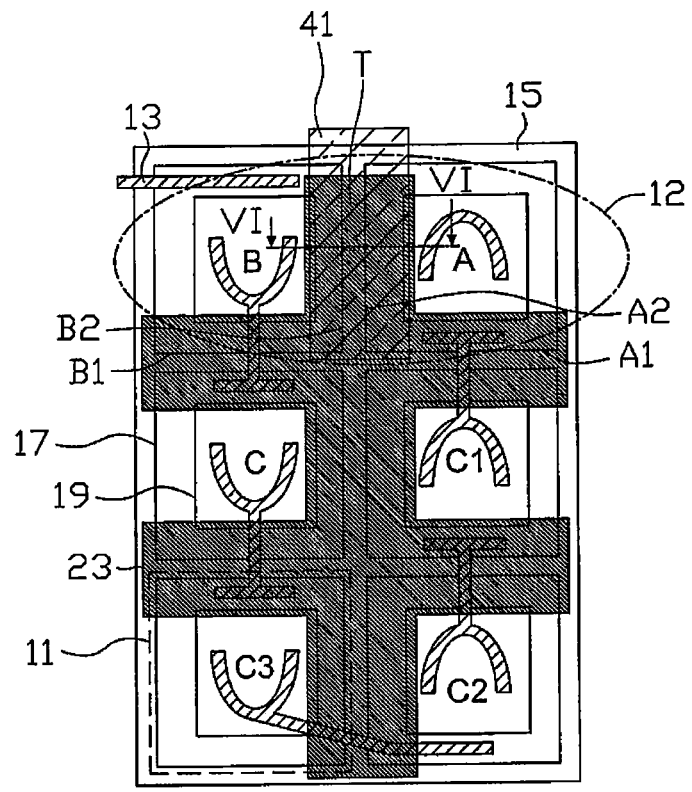
FIG. 5 illustrates a light emitting device in accordance with an embodiment of the disclosure.

FIG. 5 shows a light emitting device 40 in accordance with another embodiment of the present disclosure. In the embodiment, reducing the electrical field strength is another method to prevent the ESD damage. As shown in FIG. 5, an insulating wall 41 is formed between LED A and LED B (the region with a high electric field strength or between two adjoining LED cells 11 which are electrically connected in series and with more than three LED cells 11 connected in-between). Because the insulating wall 41 is formed by the insulating material, the electric lines originating from LED A cannot be directed to LED B by penetrating the insulating wall 41 directly and should be extended along the contours of the insulating wall 41 instead. The length of the electric line is extended, and therefore the electrical field strength (E=V/D, V=potential difference, D=distance) between LED A and LED B is reduced. In order to extend the length of the electric lines between LED A and LED B, the insulating wall 41 located between LED A and LED B should be formed at the shortest route from LED A to LED B to shield the electric lines coming from LED A or LED B. In other words, as shown in FIG. 5, the thickness of the insulating wall 41 in the trench should be substantially larger than the sum of the thickness of the first semiconductor layer 17, the active layer 47, the second semiconductor layer 19, and the conducting metal 13. Preferably, the thickness of the insulating wall 41 in the trench should be larger than 1.5 times the sum of the thicknesses of the first semiconductor layer 17, the active layer 47, the second semiconductor layer 19, and the conducting metal 13.

Figure 6:
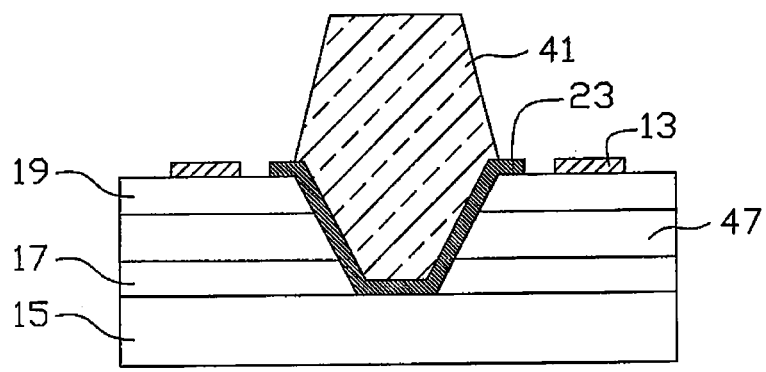
FIG. 6 illustrates a cross-section of a light emitting device along line 6-6' in FIG. 5 in accordance with an embodiment of the disclosure.

FIG. 6 is the cross-section of the 6-6' line shown in FIG. 5. In FIG. 6, the first insulating layer 23 covers conformably along the side walls of LED A and LED B (including the first semiconductor layers 17, the second semiconductor layers 19, and the active layers 47), part of the top surfaces of the LED A and LED B, and part of the top surface of the substrate in the trench T directly. Besides, the insulating wall 41 can be formed on the first insulating layer 23 and is higher than the LED A and LED B, therefore, the electric lines from LED A to LED B can be shielded by the insulating wall 41. However, the exact position of the insulating wall 41 can be modified and should not be limited. For example, the insulating wall 41 can also be formed on the top surface of the substrate 15 directly, or the insulating wall 41 can have a specific pattern formed by the traditional CVD method and the photolithography method.

Figure 7:
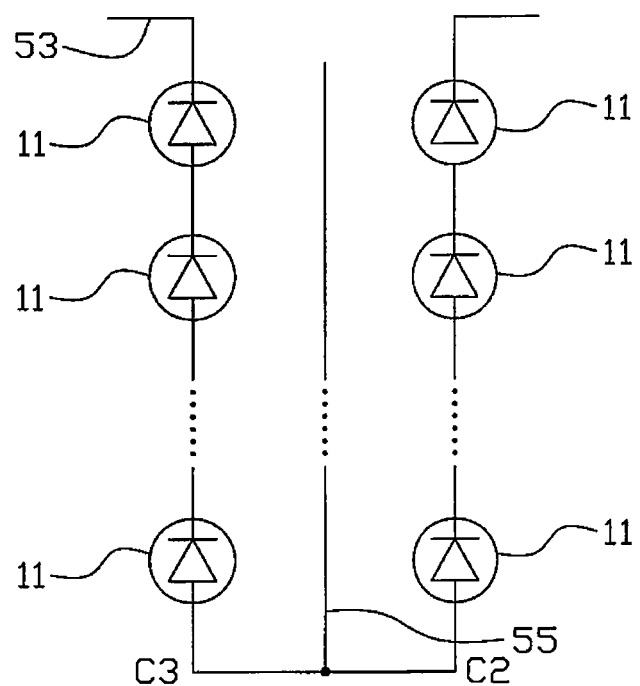
FIG. 7 illustrates an electric circuit of a light emitting device in accordance with an embodiment of the disclosure.

FIG. 7 shows an electric circuit of a light emitting device 50 in accordance with another embodiment of the present disclosure. As the experimental result indicates, a floating conductive line 55 electrically connecting to the LED cell 11 with the electric potential level between the highest potential and the lowest potential and located between the LED cell 11 with the highest potential and the LED cell 11 with the lowest potential can reduce the ESD damage. As shown in FIG. 7, a floating conductive line 55 can connect to the conducting metal 13 between LED C2 and LED C3.

Figure 8:
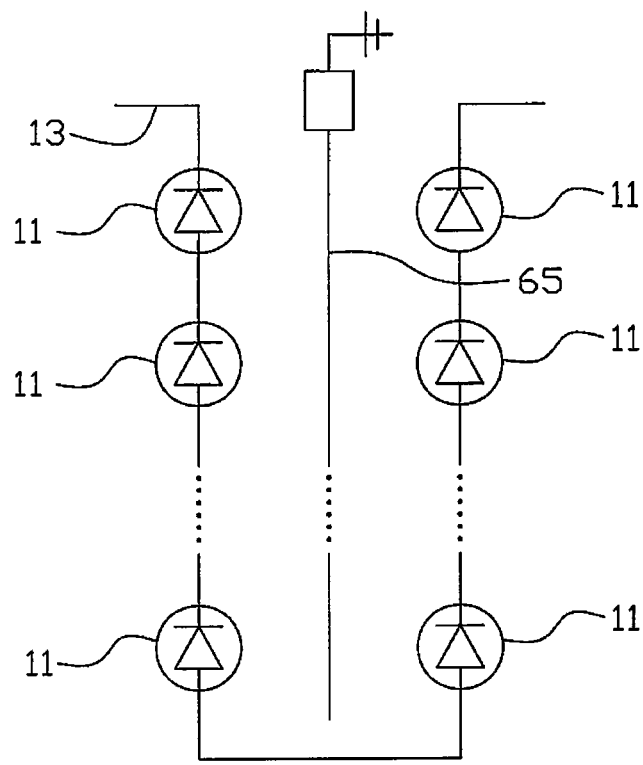
FIG. 8 illustrates an electric circuit of a light emitting device in accordance with an embodiment of the disclosure.

Similar to FIG. 7, FIG. 8 is an electric circuit of a light emitting device 60 in accordance with another embodiment of the present disclosure. Rather than forming a floating conductive line 55 connecting to the conducting metal 13, one grounding conductive line 65 is formed between the LED cell 11 with the highest potential and the LED cell 11 with the lowest potential, and the grounding conductive line 65 is grounded by connecting to outside.

Figure 9:
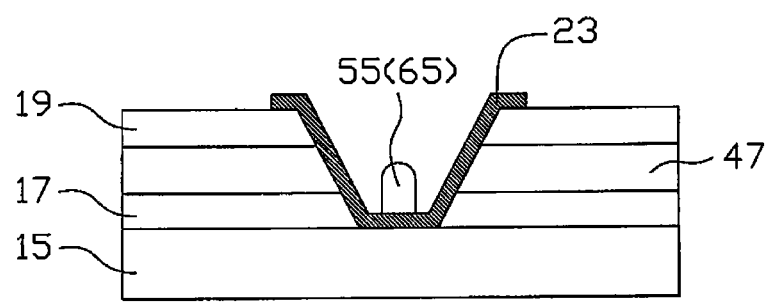
FIG. 9 illustrates a cross-section of a light emitting device in accordance with an embodiment of the disclosure.

FIG. 9 is the cross-section of the embodiment shown in FIG. 7 and FIG. 8. The floating (grounding) conductive line 55 (65) can be formed on the insulating layer 23 or on the substrate 15 directly between two LED cells 11.

Figure 10A:
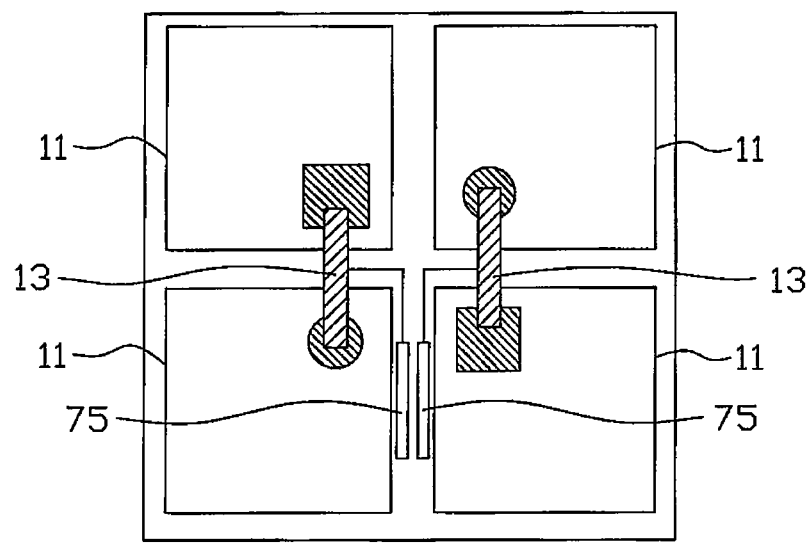
FIG. 10A illustrates a light emitting device in accordance with an embodiment of the disclosure.

FIG. 10A discloses a light emitting device 70 in accordance with another embodiment of the present disclosure. Since the ESD damage normally causes the failure of the LED and is not easy to be avoided, additional ESD damage regions 75 are formed to confine the ESD damage happened in the specific regions. As shown in FIG. 10A, there are two additional ESD damage regions 75 extending from the conductive metals 13. Because the two additional ESD damage regions 75 are facing to each other closely, the higher electric field strength is caused therebetween, and the ESD damage may happen between the additional ESD damage regions 75 more easily. The additional ESD damage regions 75 are two additional metal plates that do not function with the LED cells 11, therefore, they can help to maintain the working function of the LED cells 11. Besides, the edge of the additional ESD damage region 75 facing the other one can be roughened to form tips, which raises the probability of the ESD phenomenon happening in the predetermined regions.

Figure 10B:
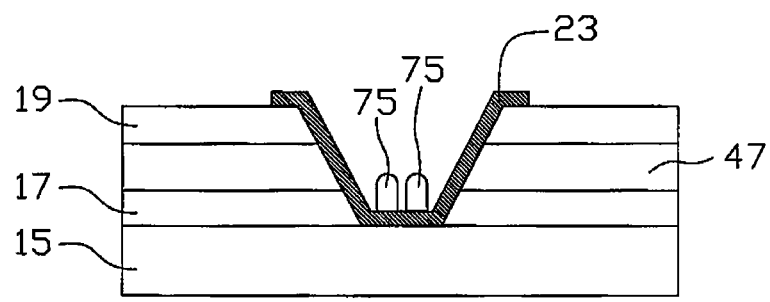
FIG. 10B illustrates a cross-section of a light emitting device in accordance with an embodiment of the disclosure.

FIG. 10B is the cross-section of the embodiment shown in FIG. 10A. The two additional ESD damage regions 75 are formed on the insulating layer 23 or on the substrate 15 directly between two LED cells 11.

Figure 11:
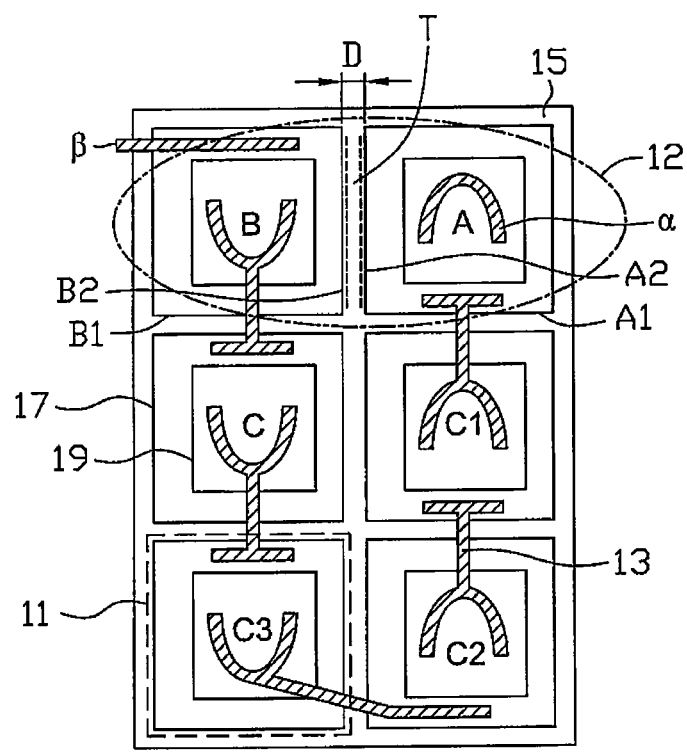
FIG. 11 illustrates a light emitting device in accordance with an embodiment of the disclosure.

FIG. 11 shows a light emitting device 80 in accordance with another embodiment of the present disclosure. Because the ESD damage comes from the high electric field strength, and the electric field strength between two objects depends on the potential difference and the distance of the two objects. As shown in FIG. 11, indicated by the experimental result, the distance (D) between two adjoining LED cells 11 with more than three LED cells 11 connected in-between should be larger than 15 μm. Preferably, the distance (D) between two adjoining LED cells 11 with more than three LED cells 11 connected therein should be more than 30 μm. The distance (D) here is identified as the shortest distance between two first semiconductor layers 17 of two adjoining LED cells 11. In addition, the "adjoining LED cells" here means any two LED cells 11 with the shortest distance from the first semiconductor layers 17 of the LED cell to the first semiconductor layer 17 of the other LED cell, wherein the distance (D) is preferred to be smaller than 50 μm.

Figure 12:
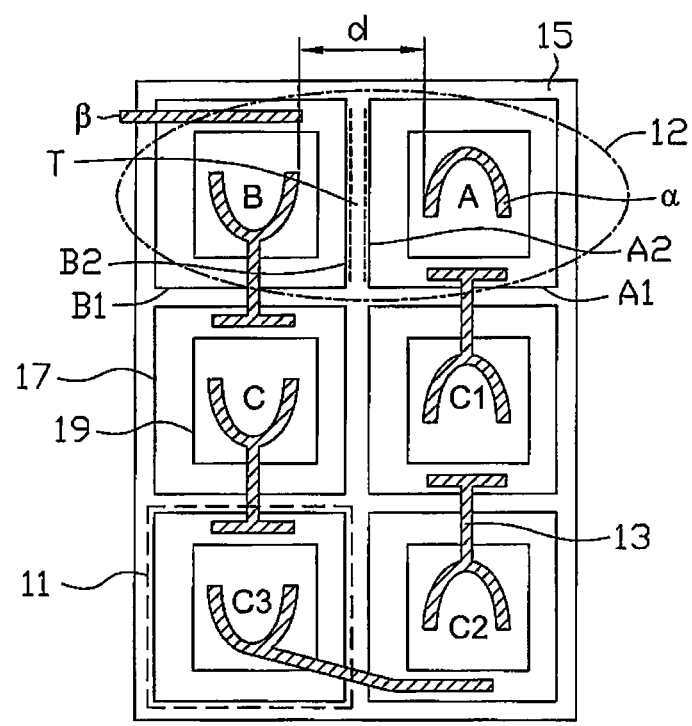
FIG. 12 illustrates a light emitting device in accordance with an embodiment of the disclosure.

FIG. 12 shows a light emitting device 90 in accordance with another embodiment of the present disclosure. Similar to the embodiment shown in FIG. 11, to prevent the ESD damage happened between the conducting metals 13 of the two adjoining LED cells 11, the distance (d) of the conducting metals 13 of the two adjoining LED cells 11 should be more than 100 μm. This design is suitable for the two adjoining LED cells 11 with large potential difference therebetween and/or with more than three LED cells 11 connected in-between. Preferably, the distance (d) of the conducting metals 13 of the two adjoining LED cells 11 should be more than 80 μm. The "distance of the conducting metals" here is defined as the shortest distance from the conducting metal 13 of the LED cell 11 to the conducting metal 13 of the adjoining LED cell. In addition, the "adjoining light-emitting diode cells" here means any two LED cells 11 with the shortest distance from the first semiconductor layers 17 of the LED cell 11 to the first semiconductor layer 17 of the other LED cell 11, wherein the distance (d) is preferred to be smaller than 50 μm.

Figure 13:
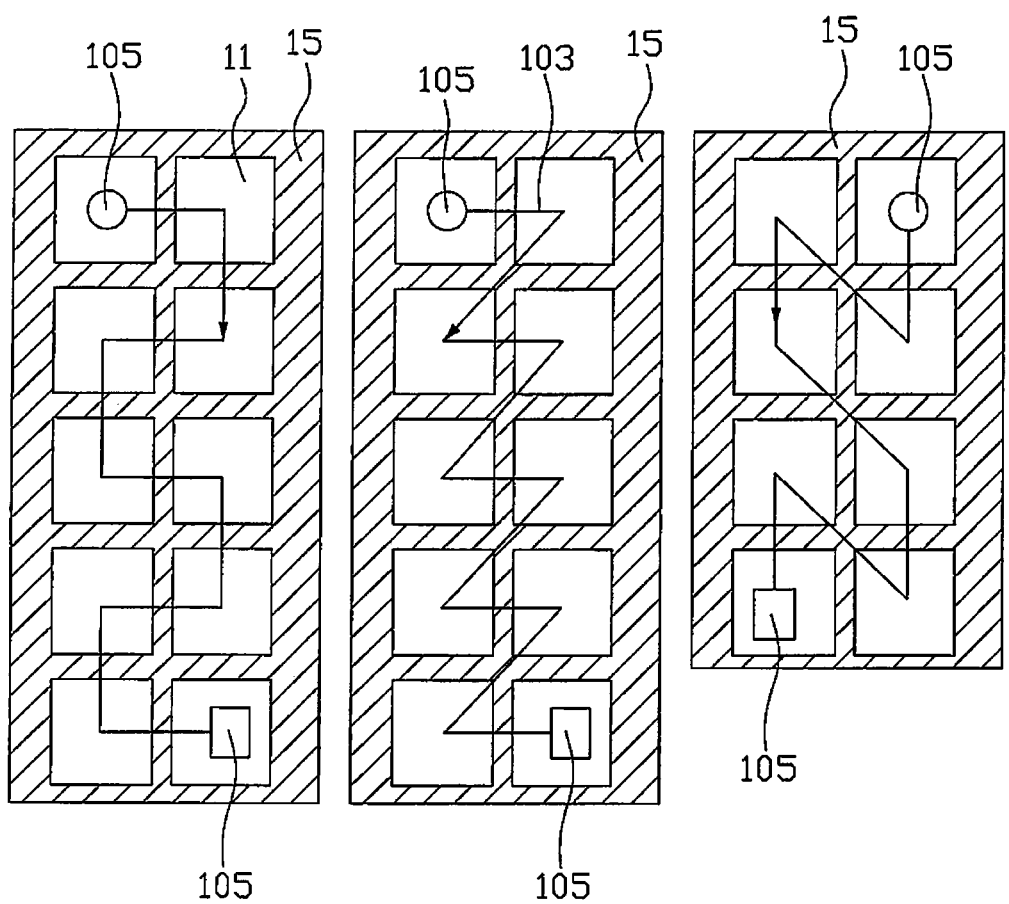
FIG. 13 illustrates light emitting devices in accordance with an embodiment of the disclosure.

As shown in FIG. 13, the high electric field strength often occurs between two adjoining LED cells 11 with more than three LED cells 11 connected in-between (with large potential difference), such as LED cells A and B shown in FIG. 12. In order to prevent the LED cells 11 with large potential difference from being too close, when a series of LED cells 11 formed on a substrate 15, the series of LED cells 11 should change its arranging direction when certain amount of LED cells 11 are aligned with one direction, for example, which more than three LED cells 11 aligned with. In other words, the arranging direction of the series of the LED cells 11 should be changed often to avoid any two LED cells 11 with large potential difference or with more than three LED cells 11 connected in-between located adjoining to each other. FIG. 13 shows three diagrams of different arrange configurations of a series LED cells 11 on a single substrate 15 in accordance with embodiments of the present disclosure. In each diagram, a series of the LED cells 11 disposed (formed by epitaxy or attached to the substrate by metal bonding or glue bonding) on a single substrate 15 with the bonding pads 105 formed at two ends of the series of the LED cells. The arrow here indicates the extending direction 103 (the connection order) of the LED cells 11. In each arrangement, any two of the adjoining LED cells do not have the large potential difference therebetween. In detail, as shown in FIG. 13, each serially-connected LED array comprises at least eight LED cells and at least more than two branches. In order not to let any two of the adjoining LED cells have too large potential difference therebetween, each LED array shown in the figure changes its arranging direction with every two successive LED cells.

Figure 14:
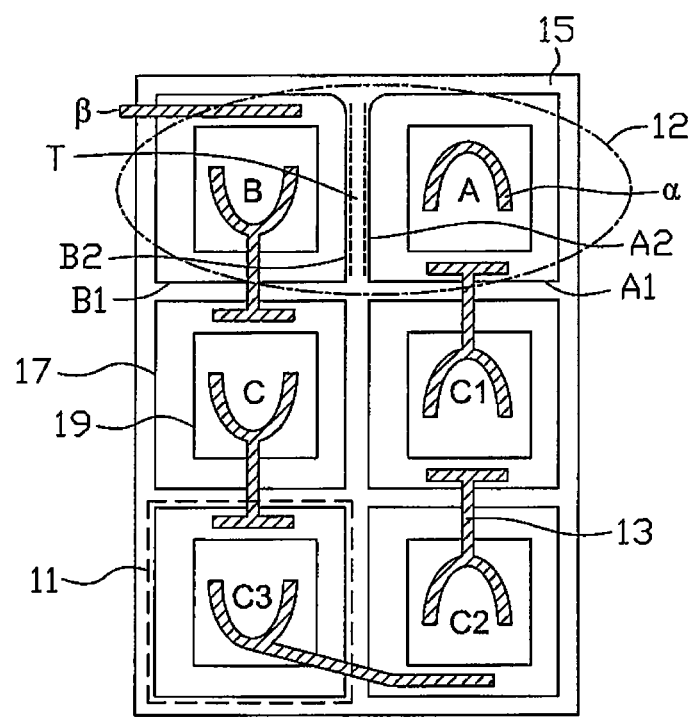
FIG. 14 illustrates a light emitting device in accordance with an embodiment of the disclosure.

FIG. 14 shows a light emitting device 110 in accordance with another embodiment of the present disclosure. According to the surface electric charge distribution of the objects, the surface electric discharge density per unit area of the object is large when the object has a small curvature radius. Another cause of the damage of the LED cells 11 called "point discharge" often happens at the position with high surface electric discharge density per unit area. Therefore, to prevent the "point discharge" phenomenon, the contours of the LED cells 11 are modified in this embodiment. As shown in FIG. 14, the upper corners of the first semiconductor layer 17 between LED cells A and B are patterned, for example, rounded. The above modification is not limited to the identified positions, and all of the corners of the LED cells 11 can be patterned to be rounded. Furthermore, not only the first semiconductor layer 17 but the second semiconductor layer 19 can also be rounded, especially for the edges of the LED cell close to the second side, which has the smaller distance from the adjoining LED cell. Preferably, the radius of the curvature of the patterned corner is not less than 15 μm.

Figure 15:
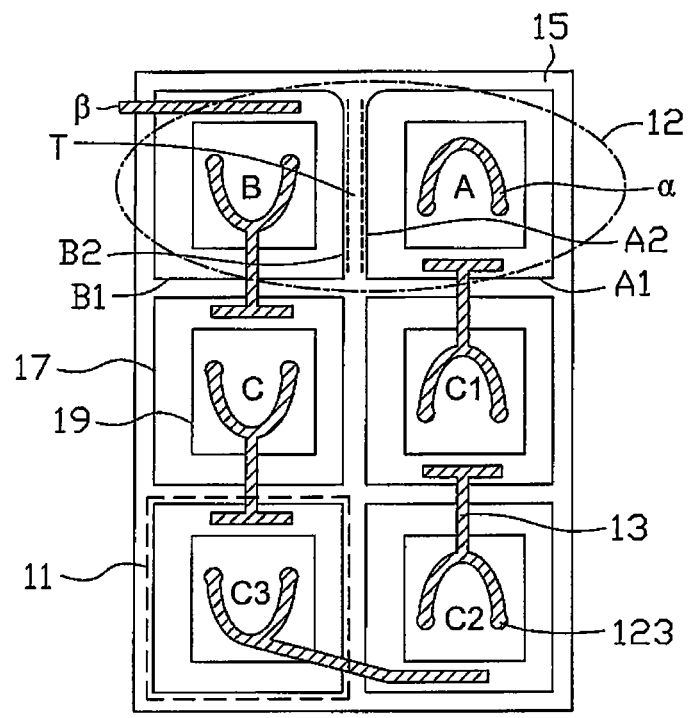
FIG. 15 illustrates a light emitting device in accordance with an embodiment of the disclosure.

With the similar concept of the embodiment disclosed in FIG. 14, to prevent the "point discharge" phenomenon, FIG. 15 shows that the terminal 123 of each divided metal line of the LED cells 11 can be patterned by forming the round metal plates 123. The shape of the terminal metal 123 is not limited to the round shape. As indicated by the experimental result, any shape of the terminal metal 123 formed at the terminal with the enlarged portion or the radius larger than the line width of the conducting metal 13 can be formed to reduce the "point discharge" damage.

Figure 16:
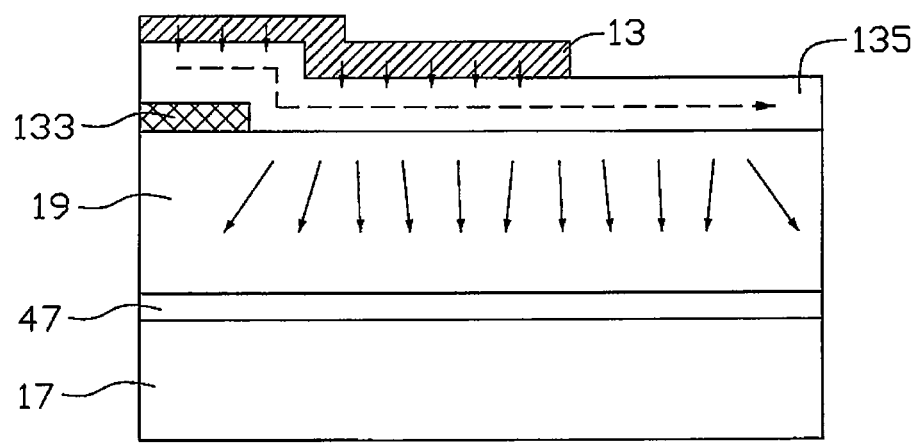
FIG. 16 illustrates a cross-section of a light emitting device in accordance with an embodiment of the disclosure.

FIG. 16 shows a cross-section of a light emitting device 130 in accordance with another embodiment of the present disclosure. In order to reduce the undesirable discharge, a smoother path facilitating the current flow can help. As shown in FIG. 16, in order to let the current spread from the conducting metal widely, a current blocking layer 133 is provided beneath the conducting metal 13. The current blocking layer 133 is made by a dielectric material which is an insulator, such as $SiO_{y1}$ or $SiN_{y2}$. However, the current blocking layer also blocks most paths that the current flows. If the current cannot disperse along the normal path, it leaks out in other forms such as ESD or point discharge. Therefore, in this embodiment, the current blocking layer 133 is formed beneath the conducting metal 13, not under the terminal of the conducting metal 13. This design let the current at the terminal of the conducting metal 133, where the discharge is caused most easily, to flow more smoothly and reduce the probability the current leaking out along the discharge path. Besides, a transparent conducting layer 135 such as ITO, IZO, ZnO, AZO, thin metal layer, or the combination thereof can also be optionally formed on the second semiconductor layer to help the current spreading.

The embodiments mentioned above are used to describe the technical thinking and the characteristic of the invention and to make the person with ordinary skill in the art to realize the content of the invention and to practice, which could not be used to limit the claim scope of the present invention. That is, any modification or variation according to the spirit of the present invention should also be covered in the claim scope of the present disclosure. For example, the electric connecting method is not limited to the serial connection. The ESD protection methods shown as the embodiments above can be applied to any two adjoining light emitting diode cells with a high electric field strength over a certain value or with more than three LED cells connected in-between electrically connect in parallel or in the combination of serial and parallel.

What is claimed is:

1. A light emitting device, comprises:
   a substrate; and
   a serially-connected LED array epitaxially formed on the substrate, comprising a first LED cell, a second LED cell, and a serially-connected LED sub-array comprising at least three LED cells intervening the first and the second LED cells; wherein each LED cell of the serially-connected LED array comprises:
   a first semiconductor layer formed on the substrate;
   a second semiconductor layer formed on the first semiconductor layer; and
   an active layer formed between the first semiconductor layer and the second semiconductor layer;
   wherein the first LED cell and the second LED cell are adjacent to each other, and the distance between the first semiconductor layer of the first LED cell and the first semiconductor layer of the second LED cell is larger than 30 μm, wherein one of the first semiconductor layers and/or one of the second semiconductor layers of the LED cells comprises at least a round corner with a radius of the curvature not less than 15 μm.

2. The light emitting device as claimed in claim 1, wherein the first LED cell and the second LED cell each comprises a side wall adjacent to each other and a top surface, and a first insulating layer covers the side walls and part of the top surfaces of the first LED cell and the second LED cell; and a second insulating layer covers the exposed top surfaces of the first LED cell and the second LED cell.

3. The light emitting device as claimed in claim 2, wherein the first insulating layer covers conformably on the side walls of the first LED cell and the second LED cell, and/or the second insulating layer covers most of the top surfaces of the first LED cell and the second LED cell.

4. The light emitting device as claimed in claim 2, wherein the second insulating layer comprises multiple layers.

5. The light emitting device as claimed in claim 1, wherein one of the LED cells comprises a conducting metal on the second semiconductor layer, and the conducting metal comprises an extending part with at least one finger with an enlarged terminal.

6. The light emitting device as claimed in claim 1, wherein each LED cell of the serially-connected LED array further comprises a conducting metal arranged on the second semiconductor layer, and a minimum distance between the conducting metal of the first LED cell and the conducting metal of the second LED cell is larger than 80 µm.

7. The light emitting device as claimed in claim 1, wherein one of the LED cells further comprises a conducting metal on the second semiconductor layer and a current blocking layer formed beneath the conducting metal.

8. The light emitting device as claimed in claim 1, wherein the serially-connected LED array comprises at least eight LED cells and the LED array changes its arranging direction every two successive LED cells.

9. A light emitting device, comprises:
a substrate; and
a serially-connected LED array epitaxially formed on the substrate, comprising a first LED cell, a second LED cell, and a serially-connected LED sub-array comprising at least three LED cells intervening the first and the second LED cells; wherein each LED cell of the serially-connected LED array comprises:
a first semiconductor layer formed on the substrate;
a second semiconductor layer formed on the first semiconductor layer; and
an active layer formed between the first semiconductor layer and the second semiconductor layer, wherein the first LED cell and the second LED cell are adjacent to each other, and the distance between the first semiconductor layer of the first LED cell and the first semiconductor layer of the second LED cell is larger than 30 µm, wherein each of the first and second LED cell comprises a first side and a second side, the first sides of the first LED cell and the second LED cell neighbor to the LED sub-array, and the second side of the first LED cell neighbors to the second side of the second LED cell, wherein the corners of the first semiconductor layer of the first LED cell and the second LED cell near the second sides are round.

10. The light emitting device as claimed in claim 1, further comprising a protecting structure formed between the first LED cell and the second LED cell.

11. The light emitting device as claimed in claim 2, wherein the substrate comprises a top surface, and the first insulating layer between the first LED cell and the second LED cell directly contacts the top surface of the substrate.

12. A light emitting device, comprising:
a substrate; and
a serially-connected LED array on the substrate, comprising a first LED cell, a second LED cell, and a serially-connected LED sub-array comprising at least three LED cells intervening the first and second LED cells; wherein each of the first and second LED cells comprises a first side and a second side, the first side of the first LED cell and/or the second LED cell neighbors to the LED sub-array, and the second side of the first LED cell neighbors to the second side of the second LED cell; and
wherein a first minimum distance between the second side of the first LED cell and the second side of the second LED cell is larger than a second minimum distance between any two adjacent LED cells in the LED sub-array, wherein each LED cell comprises an active layer arranged between a first semiconductor layer and a second semiconductor layer, a conducting metal arranged on the second semiconductor layer; and the conducting metal comprises an extending part with at least one finger, wherein one of the first semiconductor layers and/or one of the second semiconductor layers of the LED cells comprises at least a round corner with a radius of the curvature not less than 15 µm.

13. The light emitting device as claimed in claim 12, wherein the first minimum distance is larger than 15 µm and smaller than 50 µm.

14. The light emitting device as claimed in claim 12, wherein the first LED cell and the second LED cell each comprises a side wall adjacent to each other and a top surface, and a first insulating layer covers the side walls and part of the top surfaces of the first LED cell and the second LED cell; and a second insulating layer covers the exposed portion of the first insulating layer between the first LED cell and the second LED cell.

15. The light emitting device as claimed in claim 14, wherein the first insulating layer covers conformably on the side walls of the first LED cell and the second LED cell.

16. The light emitting device as claimed in claim 14, wherein the second insulating layer comprises multiple layers.

17. The light emitting device as claimed in claim 12, wherein the minimum distance between the conducting metal of the first LED cell and the conducting metal of the second LED cell is larger than 80 µm.

18. The light emitting device as claimed in claim 12, wherein one of the LED cells further comprises a current blocking layer formed beneath the conducting metal.

19. The light emitting device as claimed in claim 12, wherein the serially-connected LED array comprises at least eight LED cells and the LED array changes its arranging direction every two successive LED cells.

20. A light emitting device, comprising:
a substrate; and
a serially-connected LED array on the substrate, comprising a first LED cell, a second LED cell, and a serially-connected LED sub-array comprising at least three LED cells intervening the first and second LED cells; wherein each of the first and second LED cells comprises a first side and a second side, the first side of the first LED cell and/or the second LED cell neighbors to the LED sub-array, and the second side of the first LED cell neighbors to the second side of the second LED cell; and wherein a first minimum distance between the second side of the first LED cell and the second side of the second LED cell is larger than a second minimum distance between any two adjacent LED cells in the LED sub-array, wherein the corners of the first semiconductor layer of the first LED cell and the second LED cell near the second sides are round.

21. The light emitting device as claimed in claim 12, further comprising a protecting structure formed between the first LED cell and the second LED cell.

22. The light emitting device as claimed in claim 14, wherein the substrate comprises a top surface, and the first insulating layer between the first LED cell and the second LED cell directly contacts the top surface of the substrate.

23. The light emitting device as claimed in claim 9, wherein the first LED cell and the second LED cell each comprises a side wall adjacent to each other and a top surface, and a first insulating layer covers the side walls and part of the top surfaces of the first LED cell and the second LED cell; and a second insulating layer covers the exposed top surfaces of the first LED cell and the second LED cell.

24. The light emitting device as claimed in claim 23, wherein the first insulating layer covers conformably on the side walls of the first LED cell and the second LED cell, and/or the second insulating layer covers most of the top surfaces of the first LED cell and the second LED cell.

25. The light emitting device as claimed in claim 23, wherein the second insulating layer comprises multiple layers.

26. The light emitting device as claimed in claim 9, wherein one of the LED cells comprises a conducting metal on the second semiconductor layer, and the conducting metal comprises an extending part with at least one finger with an enlarged terminal.

27. The light emitting device as claimed in claim 9, wherein each LED cell of the serially-connected LED array further comprises a conducting metal arranged on the second semiconductor layer, and a minimum distance between the conducting metal of the first LED cell and the conducting metal of the second LED cell is larger than 80 μm.

28. The light emitting device as claimed in claim 9, wherein one of the LED cells further comprises a conducting metal on the second semiconductor layer and a current blocking layer formed beneath the conducting metal.

29. The light emitting device as claimed in claim 9, wherein the serially-connected LED array comprises at least eight LED cells and the LED array changes its arranging direction every two successive LED cells.

30. The light emitting device as claimed in claim 9, further comprising a protecting structure formed between the first LED cell and the second LED cell.

31. The light emitting device as claimed in claim 23, wherein the substrate comprises a top surface, and the first insulating layer between the first LED cell and the second LED cell directly contacts the top surface of the substrate.

32. The light emitting device as claimed in claim 20, wherein the first minimum distance is larger than 15 μm and smaller than 50 μm.

33. The light emitting device as claimed in claim 20, wherein the first LED cell and the second LED cell each comprises a side wall adjacent to each other and a top surface, and a first insulating layer covers the side walls and part of the top surfaces of the first LED cell and the second LED cell; and a second insulating layer covers the exposed portion of the first insulating layer between the first LED cell and the second LED cell.

34. The light emitting device as claimed in claim 33, wherein the first insulating layer covers conformably on the side walls of the first LED cell and the second LED cell.

35. The light emitting device as claimed in claim 33, wherein the second insulating layer comprises multiple layers.

36. The light emitting device as claimed in claim 20, wherein each LED cell of the serially-connected LED array further comprises a conducting metal arranged on the second semiconductor layer, and the minimum distance between the conducting metal of the first LED cell and the conducting metal of the second LED cell is larger than 80 μm.

37. The light emitting device as claimed in claim 20, wherein one of the LED cells further comprises a conducting metal on the second semiconductor layer and a current blocking layer formed beneath the conducting metal.

38. The light emitting device as claimed in claim 20, wherein the serially-connected LED array comprises at least eight LED cells and the LED array changes its arranging direction every two successive LED cells.

39. The light emitting device as claimed in claim 20, further comprising a protecting structure formed between the first LED cell and the second LED cell.

40. The light emitting device as claimed in claim 33, wherein the substrate comprises a top surface, and the first insulating layer between the first LED cell and the second LED cell directly contacts the top surface of the substrate.

* * * * *